United States Patent [19]

McRight, Jr. et al.

[11] Patent Number: 4,593,207

[45] Date of Patent: Jun. 3, 1986

[54] SYNCHRONIZER CIRCUIT FOR SYNCHRONIZING THE SCAN OF A DEVICE WITH AN EXTERNALLY RECEIVED TRIGGERING SIGNAL

[75] Inventors: Tulon C. McRight, Jr.; William A. Friday; Ronald W. Mitchell, all of Huntsville, Ala.

[73] Assignee: The United States of America as represented by the Secretary of the Army, Washington, D.C.

[21] Appl. No.: 596,969

[22] Filed: Apr. 5, 1984

[51] Int. Cl.⁴ .................... H03K 5/05; H03K 5/156; H03K 3/72

[52] U.S. Cl. ............................. 307/271; 307/593; 307/266; 250/338

[58] Field of Search ............... 307/261, 271, 266, 593; 328/127; 250/338

[56] References Cited

U.S. PATENT DOCUMENTS

| | | | |
|---|---|---|---|
| 3,605,035 | 9/1971 | Rocheleau | 307/271 |
| 3,946,322 | 3/1976 | Katz | 307/271 |
| 4,049,953 | 9/1977 | Evans | 307/271 |
| 4,504,749 | 3/1985 | Yoshida | 307/271 |

OTHER PUBLICATIONS

Magnavox article, Tank Infrared Elbow (TIRE), Magnavox Government and Industrial Electronics Company, Electro-Optical Systems, 2 pages, undated.

Barr et al., 1R18 Mark II Quality Thermal Imaging, Barr and Stroud Ltd., 4 pages, Aug. 1981.

Primary Examiner—John S. Heyman
Attorney, Agent, or Firm—Anthony T. Lane; Robert P. Gibson; Freddie M. Bush

[57] ABSTRACT

A synchronization circuit responds to externally supplied trigger input signals to provide a time adjustable output trigger pulse to a laser or other similar device at a desired time to initiate or control operation of the device. The synchronizer circuit provides a precise voltage pulse output in response to a square wave frequency signal input. The square wave input is processed and coupled to a linear comparator for subsequently driving a series connected multivibrator network. The multivibrator network is further controlled by a delay selector circuit for precisely adjusting the output time delay of the multivibrator output pulse. The output from the multivibrator network is coupled into a pulse repetition rate control circuit which is comprised of first and second series connected decade counters which also have selected outputs coupled to an array of NAND gates. Each of the NAND gates are further connected to a trigger rate selector switching circuit for selecting the repetition rate or frequency at which a triggered output from the synchronizer circuit would occur. For a trigger input pulse rate the respective NAND gates divide the pulses per second by known integer values to control the output trigger signal rate from the synchronizer circuit.

8 Claims, 4 Drawing Figures

SYNCHRONIZER CIRCUIT FOR SYNCHRONIZING THE SCAN OF A DEVICE WITH AN EXTERNALLY RECEIVED TRIGGERING SIGNAL

DEDICATORY CLAUSE

The invention described herein may be manufactured, used, and licensed by or for the Government for governmental purposes without the payment to us of any royalties thereon.

BACKGROUND OF THE INVENTION

A thermal imager or forward looking infrared (FLIR) system is a passive system that does not transmit radiation into a sector being observed or scanned, but instead detects infrared energy emanating from the target scene. The FLIR sensitivity allows it to function as a thermal sensing surveillance system for observing objects of interest at long range whether or not visibility is good or poor. FLIR capability, therefore, enables forces to observe actions of others or opposing forces without transmitting a tell-tale signal toward the opposing forces. However, when opposing forces determine that they are being observed, various steps can be taken to destroy or cripple the FLIR capability if desired. It is known that relatively concentrated laser energy, directed into a FLIR during momentary alignment between the FLIR optical axis and the laser, can damage the FLIR's optics and/or detector cells and thereby incapacitate the system. Accordingly, testing a passive FLIR, by subjecting it to pulses of energy from a remote laser, allows several factors to be determined such as the minimum amount of laser energy necessary to incapacitate the FLIR, the degree of damage at various incremental angles of incidence away from coincidence, counter measures that can be taken to reduce damage to friendly FLIR's, and measures that can be taken to increase the damage to unfriendly FLIR's To this end a scan synchronizer and pulsing system is set forth that allows precise and controllable triggering of laser pulses toward a FLIR during adjustable time periods.

SUMMARY OF THE INVENTION

A scan synchronizer/pulser system is disclosed for synchronizing the scan of a forward looking infrared device with a triggered output of a laser for directing a laser beam or pulse along the optical path from the laser into the FLIR optics to determine the damage threshold for a FLIR detector element. Signals are taken from the internal electrical circuits of the FLIR and coupled to the synchronization circuit, which prescribes a time adjustable output trigger pulse to a laser at the desired and proper time to allow the laser to irradiate the FLIR detector with known levels of output laser energy and assures that radiation strikes a preselected position of the FLIR on each pulse during the scan motion.

DESCRIPTION OF THE PREFERRED EMBODIMENT

Figure 1:
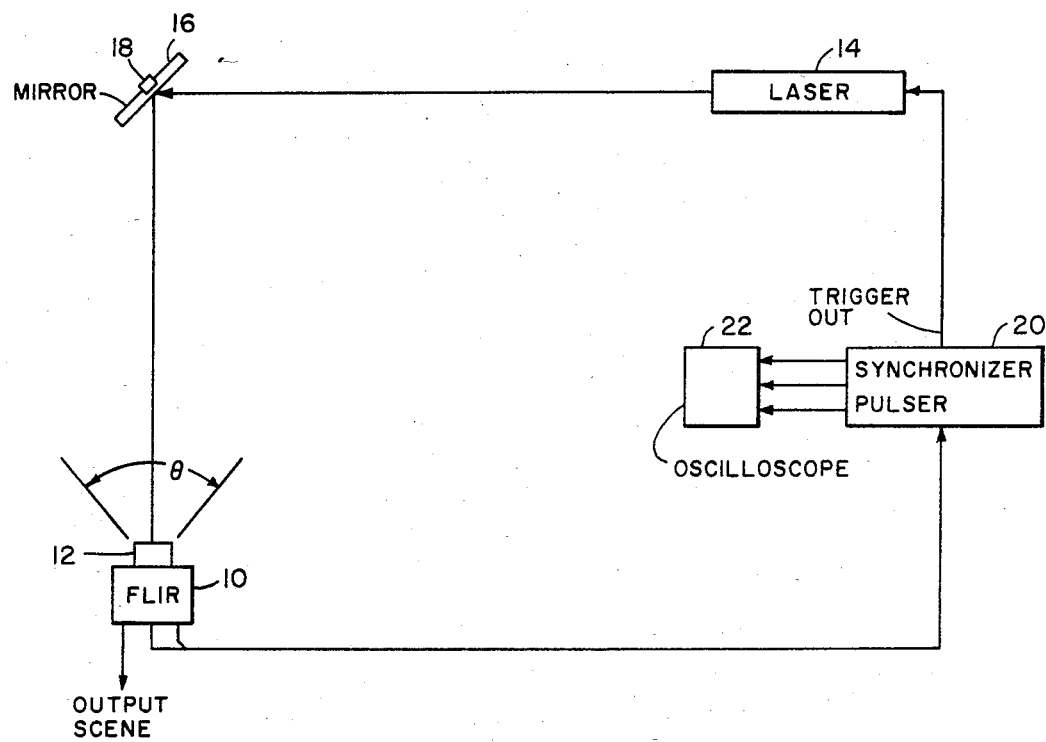
FIG. 1 is an overall system diagram showing a closed circuit operation of the scan synchronizer/pulser system.

Referring now to the drawings wherein like numbers represent like parts in the several views, an overall system diagram is shown in FIG. 1. A FLIR 10 is disposed for scanning a field of view that encompasses an angle $\theta$. The scanning optic 12 of the FLIR moves rapidly back and forth across the field of view as is well established in the prior art. The scene being scanned by the FLIR is routinely made available to an observer, such as by way of a television screen, or it may be used in weapons aiming or surveillance systems. A laser such as a 10.6 micron pulsed laser 14, is remotely disposed within the optical scan path of FLIR 10 for directing a high energy density beam, or fluence, toward FLIR 10 at a predetermined time. A mirror 16, or mirrors, may be placed in the optical path between FLIR 10 and laser 14 to create a long optical path within a confined area if desired for testing purposes. A hot-wire 18 is disposed substantially coincident with mirror 16 (or within the field of view of the FLIR if a mirror is not used). Typically, hot-wire 18 may be a long vertical wire extending above and below the edges of the mirror and disposed immediately behind the mirror in a relatively centered position so that energy radiated from the wire 18 above and below the edges of mirror 16 may be detected by FLIR optics 12 as the FLIR scans across the scene including mirror 16 and hot-wire 18. Alternatively, hot-wire 18 could be a vertical wire disposed at the top of mirror 16 and lying precisely within the same plane as the mirror.

Laser related susceptibility testing of forward looking infrared imaging systems is complicated by the rapid motion of the scanning optics 12. In order to determine the energy density required to cause permanent damage to the detector material of the FLIR 10, the pulse laser radiation must enter the FLIR at the same instant that the FLIR is looking directly along the optical path to the laser. To achieve this accuracy in timing, it is necessary to extract some scanner related timing signal from the FLIR and use it in firing the laser. Thus, by synchronizing the output laser pulses with the FLIR scan motion, radiation striking a preselected or predetermined position of the FLIR on each pulse can be assured. This synchronization is accomplished utilizing a scan synchronization/pulsing circuit 20. The synchronizer/pulser circuit 20 has no more than a 2 microsecond jitter with respect to a zero crossing detector of the scan-mirror motor drive circuit within the FLIR, which is used as the driving input to the synchronizer/pulser. A second output is taken from the post-video amplifier circuitry of the FLIR 10 to convey the timing information related to the hot-wire 18, and is routed through synchronizer/pulser circuit 20 to an oscilloscope 22. The two outputs are manually tuned to timing coincidence by using the oscilloscope 22. Once timing is established an output trigger pulse from circuit 20 to laser 14 allows the desired energy density output pulse from the laser to be directed toward the FLIR at the moment of coincidence of the optical path therebetween.

In the embodiment of FIG. 1, a U.S. Army Common Module FLIR was used. In the typical FLIR 10, a built-in scanner sweeps the infrared images seen by the FLIR optics 12 over the detector elements in onedimension. There are 60 detector elements in a vertical array, each of which generates an electrical signal proportional to the infrared energy which it sees as one line of the thermal image passing over it. The 60 elements are scanned in parallel, so that in one scan, the entire 2-dimensional thermal image is converted to 60 simultaneous real-time electrical signals. These signals are coupled to a column of 60 light-emitting diodes. The light output from these is reverse-scanned by the backside of the same moving mirror, and the resultant output is a visible image of exactly what the scene looks like in the invisible infrared spectrum.

The hot-wire used with the synchronizer, when aligned precisely in the FLIR-laser optical path, provides an index in the visible image of the exact time when the image of the laser or the mirror is scanned across a particular detector of the array. At all other times, that detector is sampling the thermal imagery of objects in the scene other than the laser. Only one detector element of the 60 in the array samples the horizontal line containing the image of the laser. The FLIR optical axis alignment determines which detector will see the laser, and at which point across the scene it will see the laser. Since the laser is pulsed on demand, it is off most of the time. The hot-wire is a steady, easily visible means of determining where the laser will appear in the field-of-view.

Figure 2:
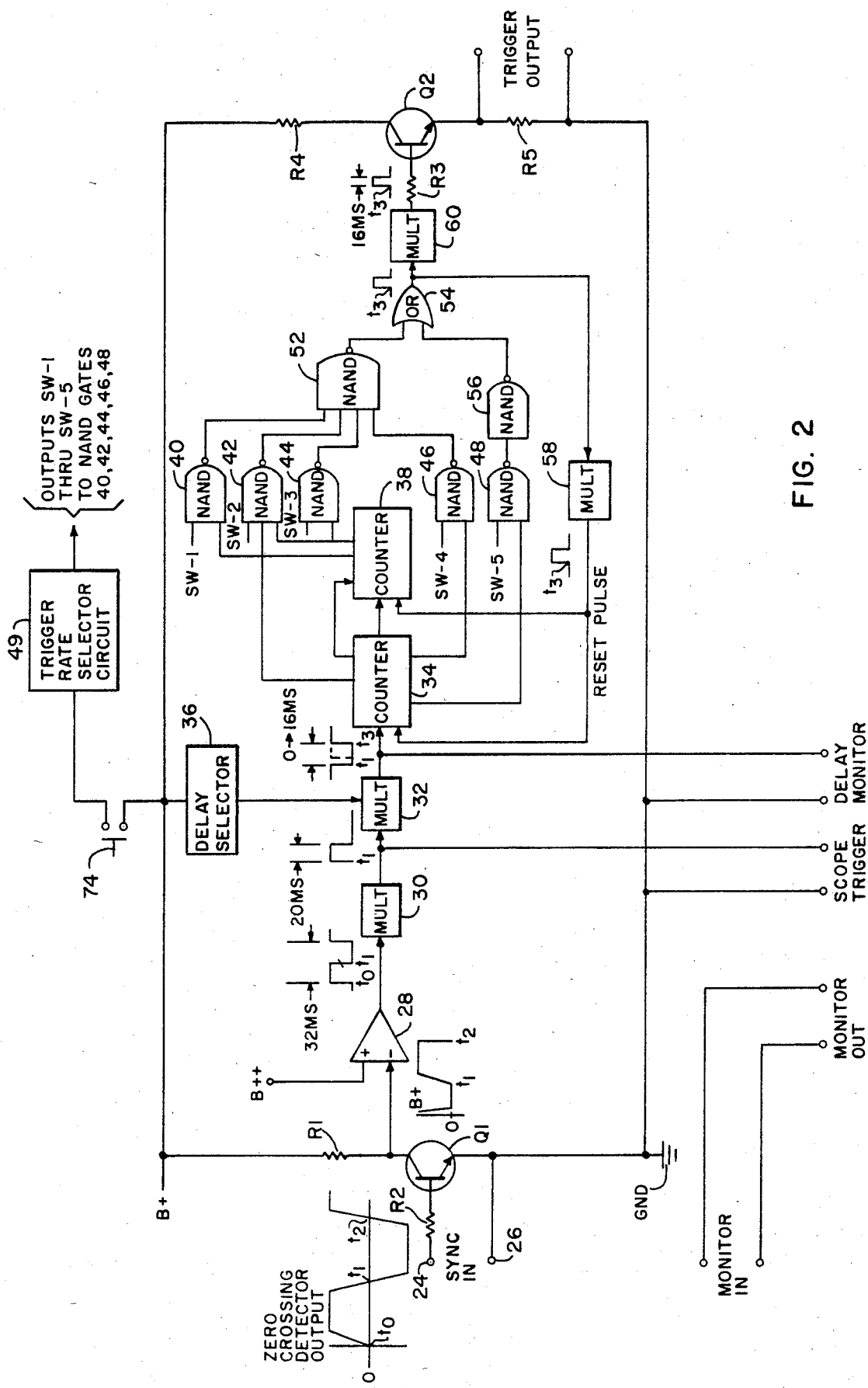
FIG. 2 is a logic diagram of a preferred embodiment of the synchronizer/pulser circuit of the system.

A logic diagram is shown of the scan synchronizer/pulser (S/P) 20 as shown in FIG. 2. As shown in FIG. 2, an NPN transister Q1 is collector coupled through a resistor R1 to a direct current power source, B+, which may for example be 15 volts. The emitter of Q1 is coupled directly to a circuit ground and the base is coupled through a resistor R2 to an input terminal 24. A second input terminal 26 is coupled to ground and together with terminal 24 receive the sync in input from the zero crossing detector of FLIR 10. An output is taken from the collector of Q1 and coupled as an input to a linear comparator 28 which compares this input signal with a voltage reference signal B++, a function of B+. The output from linear comparator 28 is coupled as an input to a monostable multivibrator 30. The output of multivibrator 30 is coupled as an input to a second multivibrator 32 and in conjunction with system ground to provide a trigger input to oscilloscope 22 (scope trigger). Monostable multivibrator 32 has an output coupled as an input to a decade counter 34 and along with system ground provides an output to oscilloscope 22 which is identified as the delay monitor output. A selectable delay circuit 36 is coupled between B+ and monostable multivibrator 32 for precisely adjusting the output time delay of the multivibrator output pulse. A second decade counter 38 is coupled to receive inputs from counter 34 and along with counter 34 is coupled to provide outputs to a plurality of NAND gates. NAND gates 40, 42, 44, 46, and 48 are disposed for selectively receiving the outputs from counter 34 and counter 38.

In particular, each of the NAND gates has one input connected to a trigger rate selector switching circuit 49. The particular inputs are identified as SW-1 coupled to gate 40, SW-2 coupled to gate 42, SW-3 coupled to gate 44, SW-4 coupled to gate 46, and SW-5 coupled to gate 48, the SW nomenclature indicating a particular position of a switch in circuit 49 which allows an enabling input to be provided to the particular NAND gate. Additionally, NAND gate 40 has an input from the Q3 output of counter 38, NAND gate 42 has an input from the Q5 output of counter 34 and an input from the Q1 output of counter 38. The Q1 output of counter 38 is also coupled as an input to NAND gate 44. The Q7 output of counter 34 is coupled as an input to NAND gate 46 and the Q6 output of counter 34 is coupled as an input to NAND gate 48. A NAND gate circuit 52 has respective inputs coupled to receive the outputs of NAND gates 40, 42, 44 and 46 and is coupled to provide a first input to an OR gate 54. The output of gate 48 is coupled as a single input to a NAND gate 56 which provides an output to another input of OR gate 54. An output of the OR gate 54 is coupled to provide a feedback through a monostable multivibrator 58 back to the reset input of both counters 34 and 38. The output from OR gate 54 is also coupled to another monostable multivibrator 60 which provides an output pulse through resistor R3 to the base of NPN transistor Q2. The collector of Q2 is coupled through a resistor R4 to B+, and the emitter of Q2 is connected through a resistor R5 to ground. The trigger output to be coupled to the laser is taken from across resistor R5.

In FIG. 2 the "monitor in" input and "monitor out" output of synchronizer/pulser 20 are coupled directly together. The output signal from the post video amplifier of FLIR 10 is coupled within the same cable bundle as the zero crossing detector signal (sync in) to synchronizer/pulser 20. However the post video amplifier output signal is merely routed through the monitor connectors of circuit 20 and coupled directly to the oscilloscope 22. This affords merely a convenience in cabling and shielding of the signals, since the post video amplifier signal could be coupled directly to the oscilloscope.

Figure 3A:
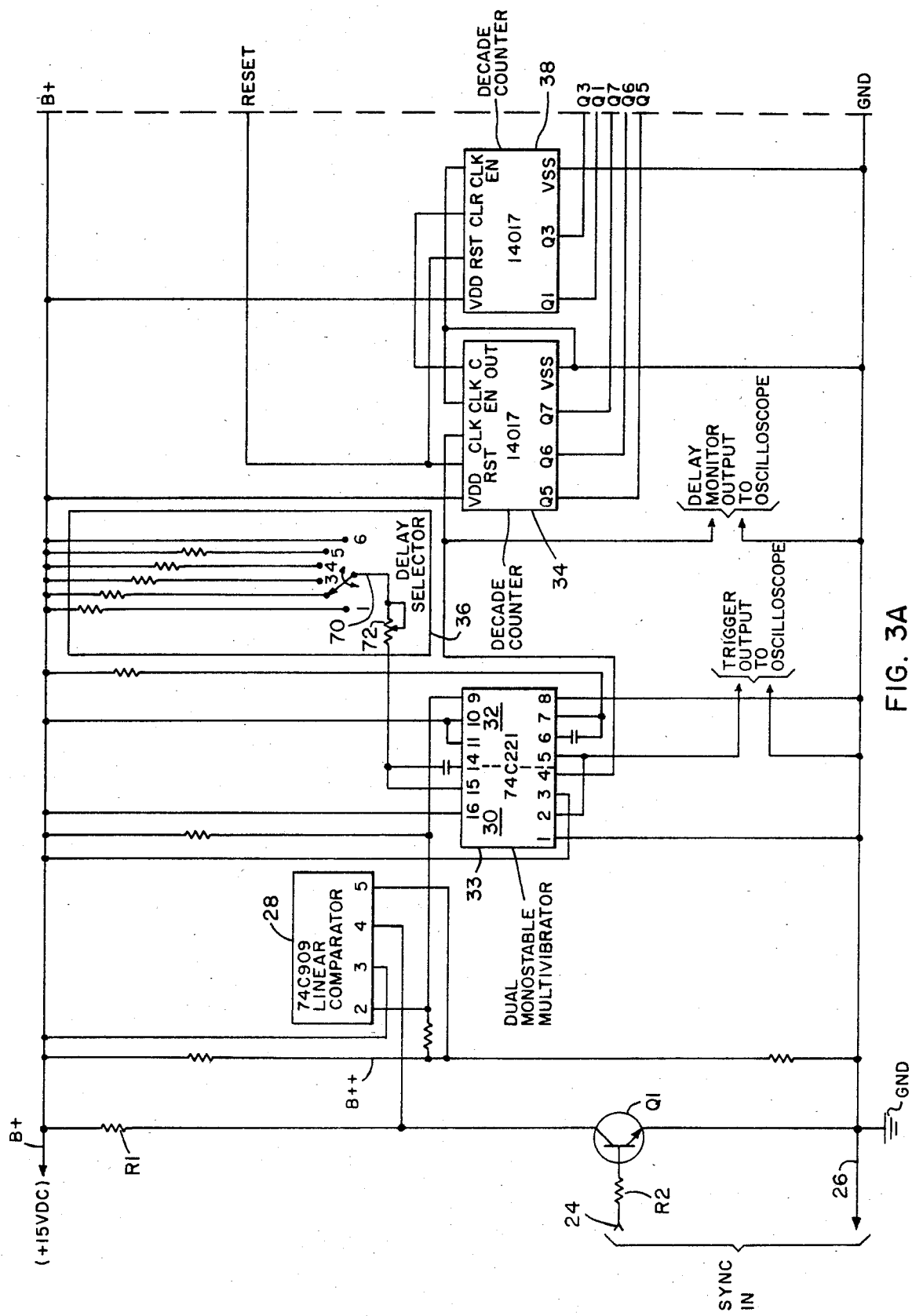
FIGS. 3A and 3B are partial block and partial schematic diagrams of the preferred embodiment of the synchronizer/pulser circuit of FIG. 2 with extraneous electrical circuit components omitted.
Figure 3B:
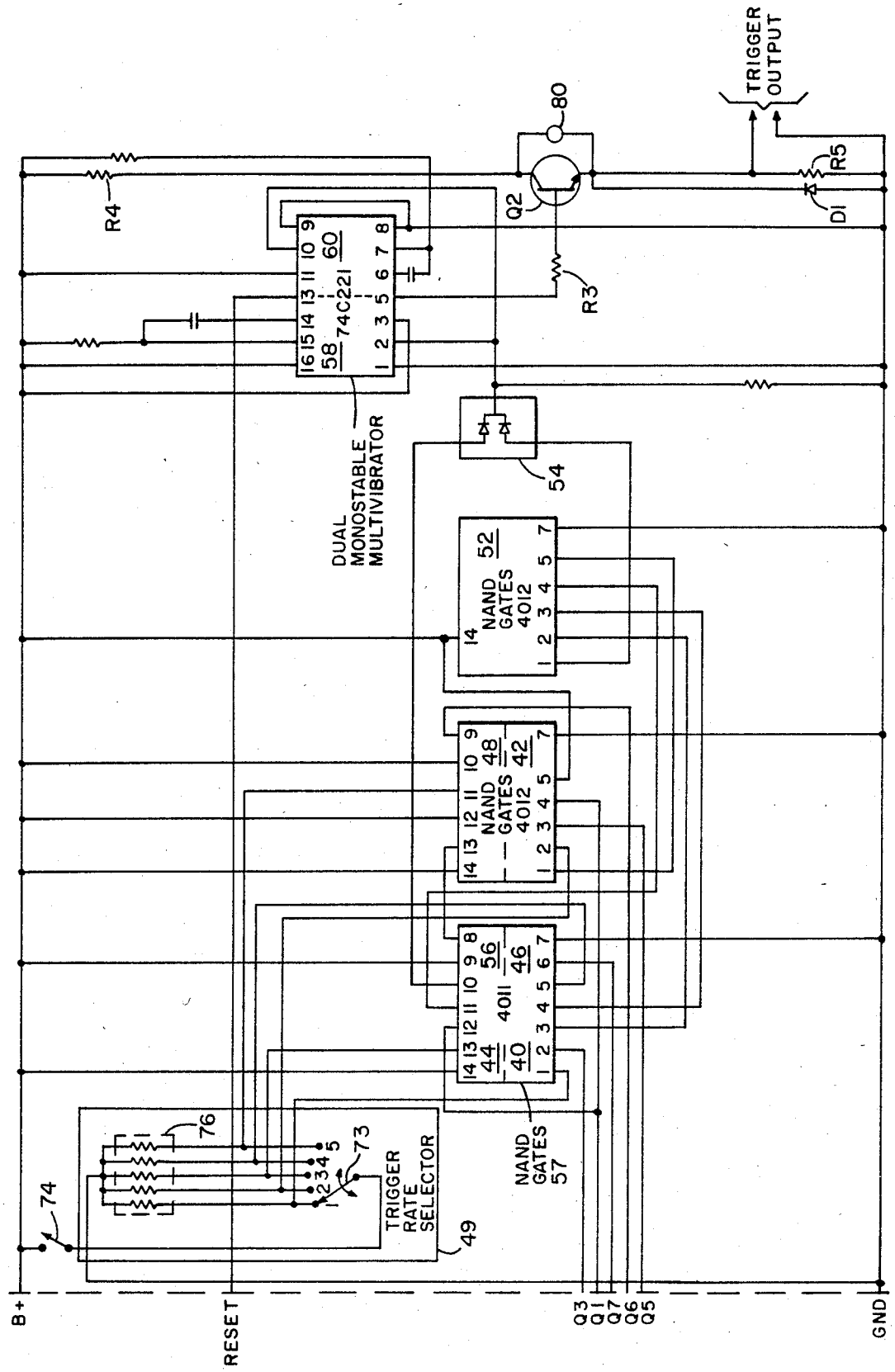

FIGS. 3A and 3B show together the scan synchronizer/pulser system schematic diagram, with some circuit components shown in detail (such as Q1 and Q2) and other circuit components shown in block diagram (such as integrated circuit 28). FIGS. 3A and 3B provide a more detailed schematic of the synchronizer/pulser system than the logic schematic of FIG. 2 and show the particular wiring details for interconnecting the various components and integrated circuit chips, as well as the voltage and ground connections. As shown in FIG. 3A voltage comparator 28 is a 74C909 integrated circuit which contains four linear comparators therein. Since only one linear comparator is used, only those terminals associated with the particular comparator used are shown on the integrated circuit. Similarly, the dual monostable multivibrators 30 and 32 are actually a common integrated circuit package 33, which is a 74C221. Counters 34 and 38 are integrated circuits 14017 decade counters. FIG. 3B shows the remainder of the synchronizer/pulser circuitry. NAND gates 40, 44, 46, and 56 are quad, two input NAND gates 4011 formed in an integrated circuit 57. NAND gates 42 and 48 are 4 input NAND gates packaged as integrated circuit 4012. Similarly NAND gate 52 is one gate of an integrated circuit 4012. OR gate 54 comprises first and second diodes (1N5062) cathode coupled respectively to the outputs of NAND gates 56 and 52. An output from either NAND gate 56 or 52 causes both the reset pulse to be generated for resetting counters 34 and 38 and an output trigger to be generated by way of multivibrators 58 and 60. Multivibrators 58 and 60 are dual monostable multivibrators in an integrated circuit package 74C221. The zone delay selector circuit 36 and trigger rate selector circuit 49 are shown in more detail in FIGS. 3A and 3B, respectively, than in FIG. 2. Zone delay selector circuit 36 includes a 6 position selector switch such as a rotary switch or a pushbutton gang switch such that only one switch position is closed at any given time. For a rotary selector switch 70, the blade terminal of the switch is coupled to a potentiometer 72 and through the potentiometer to multivibrator 30. The selectable terminals of switch 70 are connected through different resistances to the supply voltage B+, with the resistance of switch position 1 being the highest and the resistance of switch position 6 being the lowest (substantially zero). Potentiometer 72 is a 45 turn, 20K potentiometer that allows fine tuning of the precise resistance coupled to multivibrator 30. Similarly, trigger rate selector circuit 49 (FIG. 3B) includes a rotary switch having the blade or wiper arm position connected through a switch 74 to B+ and the individual contact terminals connected through respective resistors in a resistance bank 76 to ground. All of the resistors in bank 76 have the same value. As shown also in FIG. 2, switch position 1 is coupled to the input of gate 40, switch position 2 is coupled as an input to gate 42, switch position 3 is coupled as an input to gate 44, switch position 4 is coupled as an input to gate 46 and switch position 5 is coupled as an input to gate 48. Thus, all of these NAND gates are coupled through a fixed resistance to ground, maintaining these gate inputs normally at a fixed bias voltage. However, when one of the switch positions is selected, such as switch position 1, that NAND gate is coupled through the rotary switch 73 to one terminal of switch 74 which is connected on the other terminal directly to power source B+.

Transistor Q2 has a metal oxide varistor 80 connected thereacross for protecting the transistor from damage by transient voltage spikes that may occur during a laser firing. The trigger output of the synchronizer/pulser has a general purpose rectifier D1 coupled thereacross for maintaining the stability of the output pulse.

Operation of the system has been noted with respect to the overall typical drawing of FIG. 1. Operation of the synchronization/pulser circuit 20, as shown in logic format in FIG. 2 and schematically in FIGS. 3A and 3B is as follows:

The "Sync In" input is driven by a 250 millivolt square wave frequency signal from the Zero Crossing Detector's output on the FLIR Scan and Interlace Board (1A4A76). This signal synchronizes S/P 20 to the FLIR mirror scan rate and its position. The "Sync In" signal is amplified to a 0 to 15 volt square wave by transistor Q1. The inverse of the amplified signal is generated at the collector of Q1 and drives voltage comparator 28 for shaping the incoming signal's rise and fall time to meet the rise and fall time specifications for CMOS logic devices.

Multivibrator package 33 generates the trigger pulse delay. Multivibrator 30 is triggered by comparator 28 at the start of each reversed mirror scan. The S/P 20 must be synchronized on only one mirror scan direction to properly position the FLIR mirror when the laser is triggered. Triggering at the start of each reverse mirror scan accomplishes the synchronization.

Multivibrator 32 responds to the output of multivibrator 30 and generates the operator specified delay within the reversed mirror scan. This delay is generated by adjusting the value of the resistances in the RC circuit associated with multivibrator 32. This resistance is adjusted by zone selector switch 70 and potentiometer 72. Switch 70 adds a predetermined amount of resistance to delay the trigger pulse by 0, 4, 7, 10, 12, and 14 milliseconds for selector switch positions 6-1 respectively. Potentiometer 72 provides fine adjustment of the delay within the general area specified by the zone selector switch. The larger the resistances, the later the trigger pulse occurs within the reversed mirror scan.

The FLIR Scan Mirror makes sixty scans per second—thirty in the forward and thirty in the reverse direction. Multivibrator 32 generates 30 trigger pulses per second which is a high repetition rate. Counters 34 and 32 and several NAND gates reduce the trigger repetition rate to five pulses per second or less to meet the system requirements. Counters 34 and 38 count the incoming pulses from the multivibrator. Each of these counters have ten outputs representing the numbers zero through nine. Cascading the counters together allows the system to count up to 100 pulses before the count starts over. Counter 38 counts the "tens" of pulses while counter 34 counts the "ones" pulses.

NAND gates 40, 42, 44, 46, and 48 divide the 30 pulses per second trigger rate by one of the following integer values: 6,7,10,15,30 or infinite to produce approximate repetition rates at the trigger output of 5,4,3,2,1 or single shot respectively. To enable one of these gates, the trigger rate switch of circuit 49 must be closed raising the gate input voltage level to a high logic level. As an example, during normal operation all of the switches are open except for the one associated with the selected repetition rate. If a repetition rate or frequency of three pulses per second was selected, a triggered output would occur on every tenth incoming pulse from the multivibrator 32.

After the pulse passes from the NAND gates through OR gate 54, it branches in two directions. The first branch triggers multivibrator 58 causing it to reset the counters to zero. The other branch triggers the other multivibrator 60 simultaneously. Multivibrator 60 reduces the pulse width from a few millisecond widths to a 10 microsecond pulse which is required by the laser's trigger input. The 10 microsecond pulse is amplified by transistor Q2 so that S/P 20 can drive the laser's low impedance trigger input. The trigger output characteristic, developed across R5, also provides the user with the capability of driving most other equipment that requires a fast rise time pulse to trigger its internal electronics. Single shot triggering was provided herein by placing the rate selector switch on 1 pps (switch position number 1) and allowing an operator to press the manual trigger button 74 for a period long enough for one shot to take place.

The "Monitor In" is driven by one of the FLIR's video Post Amplifier Drivers. This provides a voltage representation of the hot and cold images seen by the FLIR during each mirror scan.

Oscilloscope 22 is a dual display scope. The first scope trace will display a voltage representation of the hot and cold images seen by the FLIR during each mirror scan, and taken from the Video Post Amplifier Drive circuit. The second scope trace displays the location within the FLIR's field of view where the trigger pulse will occur and is a voltage pulse taken from multivibrator 32. The "Scope Trigger Output" from multivibrator 30 triggers the scope at the beginning of each reversed mirror scan. The reverse mirror scan occurs on the negative going pulse from the zero crossing detector. Typical timing pulses are shown at various circuit points in FIG. 2. The time period beginning with $t_1$ is the time when a negative going zero crossing occurs at the input of Q1. The output of multivibrator 32 is variable between $t_1$–$t_3$, and varies from 0–16 milliseconds according to the delay circuit 36 adjustment. Reset pulses occur at $t_3$. The thin vertical hot wire 18 is placed within the field of view of FLIR 10 at the position corresponding to the laser pulse. The signal from the FLIR video post amplifier provides the timing reference which is used to determine the correct amount of delay to be selected in order to selectably irradiate the FLIR's detector array. The voltage representation of the hot wire that is generated within the video post amplifier stage looks like a voltage spike on the oscilloscope. The S/P 20 generates the synchronized trigger pulse train while the operator presses the manual trigger button.

It is important that the laser light pass through the same area of each optical element on each pulse of a pulse train directed at the FLIR. The smallest area affected is at the detector plane, where a spot the size of the focused laser beam will scan an infinitesimal point in 50 $\mu$sec. To place all pulses in a pulse train on the same spot within 1/5 of this spot diameter requires a jitter of no more than $\pm 10$ $\mu$sec between pulses in the total time from FLIR signal to synchronizer, synchronizer to laser, and laser firing. This can be accomplished with no difficulty with this synchronizer/pulser circuit.

Initial alignment of the system of FIG. 1 is a routine optical alignment procedure to establish an optical path between the FLIR and the LASER. Such procedures are well established in the art. For example, a low power laser having a visible light output may be used to direct the light beam to a desired target area. A FLIR may then be located in the target area and actually placed so that the laser beam is centered on the FLIR optics or lens cover. The visible laser may then be replaced with the desired higher power infrared laser 14. A detector may be placed in front of the FLIR optics to determine the energy density distribution across the beam of the infrared laser, if desired. Subsequently, with the laser turned off, the FLIR is turned on and provides the routine output picture of the scene which may be observed by an operator and/or recorded on television or other recording means. Simultaneously, two output signals are coupled to S/P 20 for display on oscilloscope 22.

The relationship between the two signals is adjusted by delay circuit 36. When the two oscilloscope traces show that the high voltage spike indicative of the hot-wire location is aligned with the output pulses from multivibrator 32, the delay circuit 36 has been adjusted to the point where activation of switch 74 directs the laser firing pulses at the time the FLIR and laser are aligned optically. The intensity of the laser pulse output and the point of alignment with the FLIR determines the damage to the FLIR.

In the system operation, the hot-wire is aligned perpendicular to the high speed scan direction of the FLIR. The hot-wire is symbolic of an object on the scene or in the field-of-view which provides a timing reference for the FLIR. The hot-wire can be left in place or removed after the system timing is set. A specific hot-wire, typically, may be a nichrome wire that is 2 or 3 millimeters in diameter and 10 to 15 centimeters long which is warmed by electrical current to produce heat and therefore infrared energy. The "sync in" signal which comes from the zero crossing detector in the FLIR is typical of any signal that is to be used for synchronization. Thus, when the "sync in" signal is a predictable, periodic input taken from a different type of system, it can also provide a timing base for the synchronizer/pulser system. Obviously, a square wave sync input, when properly scaled up or down, could be coupled directly to the multivibrator 30. In the system's simplest mode of construction, switch 74 may be a simple pushbutton switch or a simple toggle switch having an off, fixed-on, and spring loaded or momentary-on position. More complex switching 74 can obviously be provided within the state of the art and this particular switching function could also be relocated, if desired, in the system. The function of switch 74 is not critical but allows the laser to be inactive while other circuit operations of the synchronizer/pulser system are adjusted. This allows the laser triggering to occur only on demand and for variable periods of time as determined by the operator of the system.

Although a particular embodiment and form of the invention has been illustrated, it is apparent that various modifications and embodiments of the invention may be made by those skilled in the art without departing from the scope and spirit of the foregoing disclosure. Accordingly, the scope of the invention should be limited only by the claims appended hereto.

We claim:

1. A synchronizer circuit for providing a precise voltage pulse output comprising: a multivibrator means, a triggering means, and a delay selector circuit; said multivibrator means being coupled to said triggering means and to said delay selector circuit; said multivibrator having an input responsive to said triggering means and then providing a pulse train having a predetermined frequency and a selectively variable duty cycle in response to said delay selector circuit coupled thereto; a pulse repetition rate control means having an input responsive to the output pulses of said multivibrator means for providing a selectable output pulse frequency less than the pulse frequency of said pulse train output of said multivibrator means; a pulse shaping and driving means responsive to the pulse repetition rate control means for providing precise reduced width output driving voltage pulses; said pulse repetition rate control means comprises counting means having an input coupled to receive said multivibrator means pulse train and having plural outputs, resistance switching means having plural outputs, and gating means coupled to receive said plural outputs of said counting means and to said plural outputs of said resistance switching means for providing said selectable output pulse frequency from said control means at any one of five selectable frequencies less than the pulse frequency of the input pulse train; and a feedback circuit having an input coupled to receive the selectable output pulse frequency from said control means and providing a reset pulse output to said counting means, said counting means having a reset input coupled to receive said reset pulse output.

2. A synchronizer circuit as set forth in claim 1 wherein said triggering means is a signal conditioning means having an input circuit and an output circuit, said input circuit being disposed for responding to zero crossing voltage inputs to change output signal levels; and said output circuit being responsive to said changed output signal levels from said input circuit for providing a square wave output signal, said square wave output signal being coupled as said input to said multivibrator means.

3. A synchronizer circuit as set forth in claim 2 and further comprising monitoring means coupled to said multivibrator means for monitoring said output pulse train therefrom.

4. A synchronizer circuit as set forth in claim 3 wherein said multivibrator means comprises first and second monostable multivibrator coupled in series for responding to said input voltage and providing said output pulse train; and wherein said delay selector circuit is coupled to said second multivibrator for providing an adjustable time delay control to said second multivibrator.

5. A synchronizer circuit as set forth in claim 4 and further comprising a laser having an input coupled to receive said precise output driving voltage pulses and responsive thereto to provide periodic pulses of laser energy output.

6. A synchronizer circuit as set forth in claim 5 wherein each pulse of said pulse train from said multivibrator means is generated in response to negative going or falling input voltage levels thereto, and wherein the output pulse frequency of said pulse repetition rate control means are positive going pulses generated on the trailing edge of selected ones of said multivibrator means output pulses.

7. A synchronizer circuit as set forth in claim 6 wherein said resistance switching means is a six position mechanical rotating switch having at least five switch positions, each coupled in series with a resistor and disposed for selectably switching gating input signals to said gating means coincident with said counting means plural outputs for selecting one of said output pulse frequencies.

8. A synchronizer circuit as set forth in claim 7 wherein said pulse shaping and driving means comprises a monostable multivibrator and a transistor coupled in series, said multivibrator receiving the output from said pulse repetition rate control means and said transistor providing the precise reduced width output driving voltage pulse.

* * * * *